(12) United States Patent
Yam et al.

(10) Patent No.: US 10,504,886 B1
(45) Date of Patent: Dec. 10, 2019

(54) LOW-CAPACITANCE ELECTRO-STATIC-DISCHARGE (ESD) PROTECTION STRUCTURE WITH TWO FLOATING WELLS

(71) Applicant: Hong Kong Applied Science and Technology Research Institute Company, Limited, Hong Kong (HK)

(72) Inventors: Chun-Kit Yam, Hong Kong (HK); Chenyue Ma, Hong Kong (HK); Shuli Pan, Hong Kong (HK)

(73) Assignee: Hong Kong Applied Science and Technology Research Institute Company, Limited, Hong Kong (HK)

( * ) Notice: Subject to any disclaimer, the term of this patent is extended or adjusted under 35 U.S.C. 154(b) by 0 days.

(21) Appl. No.: 16/121,798

(22) Filed: Sep. 5, 2018

(51) Int. Cl.
*H01L 27/02* (2006.01)
*H01L 27/088* (2006.01)

(52) U.S. Cl.
CPC ........ *H01L 27/0262* (2013.01); *H01L 27/027* (2013.01); *H01L 27/0886* (2013.01)

(58) Field of Classification Search
CPC .................. H01L 27/0255; H01L 27/0262
USPC ....................................................... 257/362
See application file for complete search history.

(56) References Cited

U.S. PATENT DOCUMENTS

| | | | |
|---|---|---|---|
| 6,674,129 B1 * | 1/2004 | Colclaser | H01L 27/0255 257/355 |
| 7,277,263 B2 | 10/2007 | Duvvury et al. | |
| 9,318,479 B2 | 4/2016 | Li et al. | |
| 9,589,959 B2 | 3/2017 | Nandakumar et al. | |
| 9,653,448 B2 | 5/2017 | Zhang et al. | |
| 9,799,641 B2 | 10/2017 | Ko et al. | |
| 2002/0130390 A1 | 9/2002 | Ker et al. | |
| 2007/0052032 A1 | 3/2007 | Huang et al. | |

(Continued)

FOREIGN PATENT DOCUMENTS

| | | |
|---|---|---|
| CN | 103489904 A | 1/2014 |
| CN | 107017248 A | 8/2017 |
| CN | 107195630 A | 9/2017 |

OTHER PUBLICATIONS

ISR and Written Opinion, PCT/CN2018/106323, dated May 28, 2019.

(Continued)

*Primary Examiner* — Mark V Prenty
(74) *Attorney, Agent, or Firm* — Stuart T. Auvinen; gPatent LLC

(57) ABSTRACT

An Electro-Static-Discharge (ESD) input-protection device has an NPNP structure of a N+ cathode formed in a FINFET fin or highly-doped region over a floating P-well, and a P+ fin or highly-doped region anode formed over a floating N-well that touches the floating P-well. The floating P-well is surrounded by an isolating N-well and has a deep N-well underneath to completely isolate the floating P-well from the p-type substrate. No well taps are formed in the floating wells or in the isolating N-wells. The floating P-well and the floating N-well are thus truly floating at all times. Since the wells are floating, the NPNP structure appears as three junction diodes in series, which has a lower capacitance than a single diode that the NPNP structure would appear as when one of the wells was shorted or biased. During an ESD event the NPNP structure behaves as a single diode.

20 Claims, 9 Drawing Sheets

(56) References Cited

U.S. PATENT DOCUMENTS

2011/0147794 A1   6/2011   Gauthier, Jr. et al.

OTHER PUBLICATIONS

Chen et al, "ESD Protection Design for High-Speed Applications in CMOS Technology", 2016 IEEE 59th Int'l Midwest Symposium on Circuits and Systems, 2016.

* cited by examiner

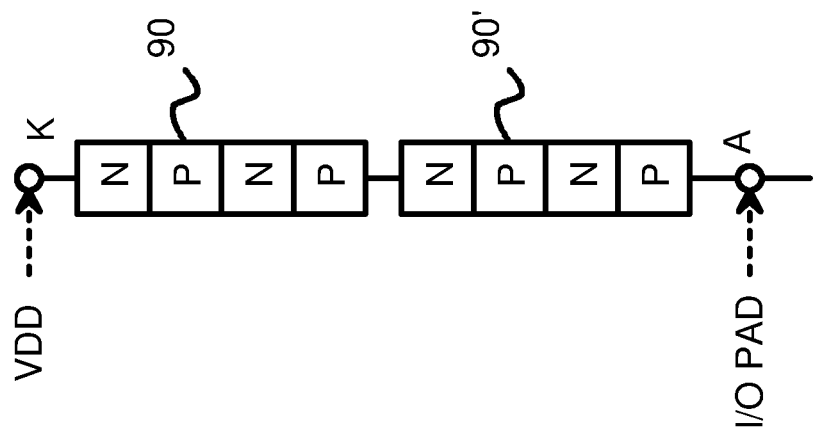

LOW-CAPACITANCE ELECTRO-STATIC-DISCHARGE (ESD) PROTECTION STRUCTURE WITH TWO FLOATING WELLS

FIELD OF THE INVENTION

This invention relates to Electro-Static-Discharge (ESD) protection circuits, and more particularly to ESD protections circuits with floating wells in Fin Field-Effect Transistor (FinFET) processes.

BACKGROUND OF THE INVENTION

Integrated circuits (IC's) are prone to damage and failure caused by an electro-static-discharge (ESD) pulse. ESD failures that occur in the factory contribute to lower yields. ESD failures may also occur in the field when an end-user touches a device.

Various ESD-protection structures have been placed near input, output, or bi-directional I/O pins of ICs. Many of these protection structures use passive components such as series resistors, diodes, and thick-oxide transistors. Other ESD structures use an active transistor to safely shunt ESD current.

As manufacturing ability improves and device sizes shrink, lower voltages are applied to transistors during normal operation. These smaller transistors are much more susceptible to over-voltage failure but can operate with a lower power-supply voltage, thus consuming less power and producing less heat.

Such smaller transistors are often placed in an internal "core" of an IC, while larger transistors with gate lengths that are above the minimum are placed around the core in the periphery. ESD-protection structures are placed in the periphery using these larger transistors.

Thinner gate oxides of the core transistors can be shorted, and substrate junctions melted, by relatively small capacitively-coupled currents applied to the tiny core devices. Static charges from a person or machinery can produce such damaging currents that are only partially blocked by the input-protection circuits in the periphery.

FIG. 1 shows a chip with several ESD-protection clamps. Core circuitry 21 contains core transistors 22, 24, which have a small channel length and can be damaged by currents at relatively low voltages. Core circuitry 21 receives a power supply voltage VDD, such as 1.8 volts, 1.2 volts, or some other value. There may be thousands of core transistors in core circuitry 21.

Protection from ESD pulses may be provided on each I/O pad, and by power clamp 26. Power clamp 26 is coupled between VDD and ground (VSS), and shunts current from an ESD pulse between the power rails.

Each I/O pad 10 may be outfitted with one or more ESD protection devices 12, 16 to protect against various possibilities. ESD protection device 16 turns on for a positive ESD pulse applied from ground to I/O pad 10, while ESD protection device 18 turns on for a positive ESD pulse applied from ground to I/O pad 11. Likewise, ESD protection device 12 turns on for a positive ESD pulse applied from I/O pad 10 to VDD while ESD protection device 14 turns on for a positive ESD pulse applied from I/O pad 11 to VDD. Power clamp 26 may also turn on in some situations.

More recently, planar MOSFET devices are being replaced by FinFET. FinFET uses a more three-dimensional transistor structure where the transistor gate is no longer within one single plane. FinFET uses a smaller area and tend to have smaller leakages than traditional planar transistors.

FIG. 2 shows a prior-art FinFET device. N+ regions 42, 44 are formed on substrate 20 and are surrounded by oxide 62. Substrate 20 can be a silicon substrate or an insulator for Silicon-On-Insulator (SOI) processes. N+ regions 42, 44 are very thin, having a slim, fin-like appearance. Between N+ region 42 and N+ region 44 is a connecting region of lightly-p-doped silicon that acts as the transistor channel. N+ region 42, the channel connecting region, and N+ region 44 can all be formed on the same fin of silicon.

Gate 52 is formed around the channel connecting region. Rather than being flat, gate 52 has an inverted U-shape that surrounds the channel connecting region between N+ regions 42, 44. Gate oxide 60 is formed on three sides of the fin-like channel connecting region rather than only on the top surface of the channel region.

FinFET transistors may have better current drive than equivalent flat transistors for the same die area due to this 3-D gate and channel structure. However, when a FinFET transistor is used for ESD protection, the high ESD currents can damage the FinFET transistor. In particular, extreme heating is sometimes seen in N+ region 42 near the junction to the channel region under gate 52. This extreme heating when a large ESD current passes through N+ region 42 can permanently damage gate oxide 60 and N+ region 42, causing the device to leak or malfunction.

Also, the thin or slim size of the fin used for N+ region 42 causes the current to be crowded into a narrow region, causing localized hot spots. Heat dissipation is hindered by the slim fin of N+ region 42 that is typically surrounded by an insulator including oxide 62 and a passivation insulator that covers everything, including N+ region 42, oxide 62, and gate 52. Oxides and other insulators are often poor heat conductors.

FIG. 3 is a cross-section of a prior-art device with an ESD structure. N-wells 30, 50 and P-well 40 are formed in lightly-doped p-type substrate 54. Core circuits are formed in P-well 40, such as an NMOS transistor formed by gate 160 over gate oxide 162 between N+ regions 46 that act as source or drain regions. P-well 40 is biased to ground (VSS) through P+ tap 48, thus providing a back or body bias to all n-channel transistors formed within P-well 40.

Similarly, a p-channel transistor is formed in N-well 50 between source/drain P+ regions 36 that is controlled by gate 150 over gate oxide 152. N+ tap 38 connects N-well 50 to power VDD. Thus the body bias to all transistors in N-well 50 is set to VDD.

There may be many instances of N-well 50 and P-well 40 and some of these may be biased to other voltages. Some instances of N-well 50 could be floating, but all instances of P-well 40 will be biased to ground since p-type substrate 54 is in contact with P-well 40, and current can flow between P-well 40 and p-type substrate 54 so that both are biased to the same voltage.

An ESD protection structure is formed in N-well 30. An I/O pad connects to P+ region 34 in N-well 30, forming a PN diode. ESD current from this diode is collected by N+ taps 32 in N-well 30 that are connected to VDD. The PN diode may be a pad-to-VDD protection diode in an ESD structure. This ESD structure may be surrounded by a guard ring of P+ tap 54 in p-type substrate 54 that surrounds N-well 30.

In a typical complementary metal-oxide-semiconductor (CMOS) device, all wells are biased through well taps. P-well 40 is tapped by P+ tap 48 to ground, p-type substrate 54 is tapped by P+ tap 53 to ground, N-well 50 is tapped to VDD by N+ tap 38, and N-well 30 is tapped to VDD by N+ tap 32. Also, even if P+ tap 48 to P-well 40 were removed, P-well 40 would be biased by p-type substrate 54 since they are of the same conduction type.

ESD protection devices typically are much larger than core circuitry to permit high ESD currents to flow without damaging the ESD device. However, these large sizes are undesirable in that they have large capacitances that degrade high-frequency signals during normal chip operation. It is desirable to design ESD protection circuits that have a low capacitance to enhance high speed operation.

What is desired is an ESD-protection circuit that has lower parasitic capacitance. An ESD input-protection circuit that carries a high current but still has a low capacitance is desired. An ESD circuit for a Fin Field-Effect Transistor (FinFET) process is desired.

BRIEF DESCRIPTION OF THE DRAWINGS

FIG. 9 shows two of the low-capacitance ESD structures connected in series.

DETAILED DESCRIPTION

The present invention relates to an improvement in Electro-Static-Discharge (ESD) protection circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 4:
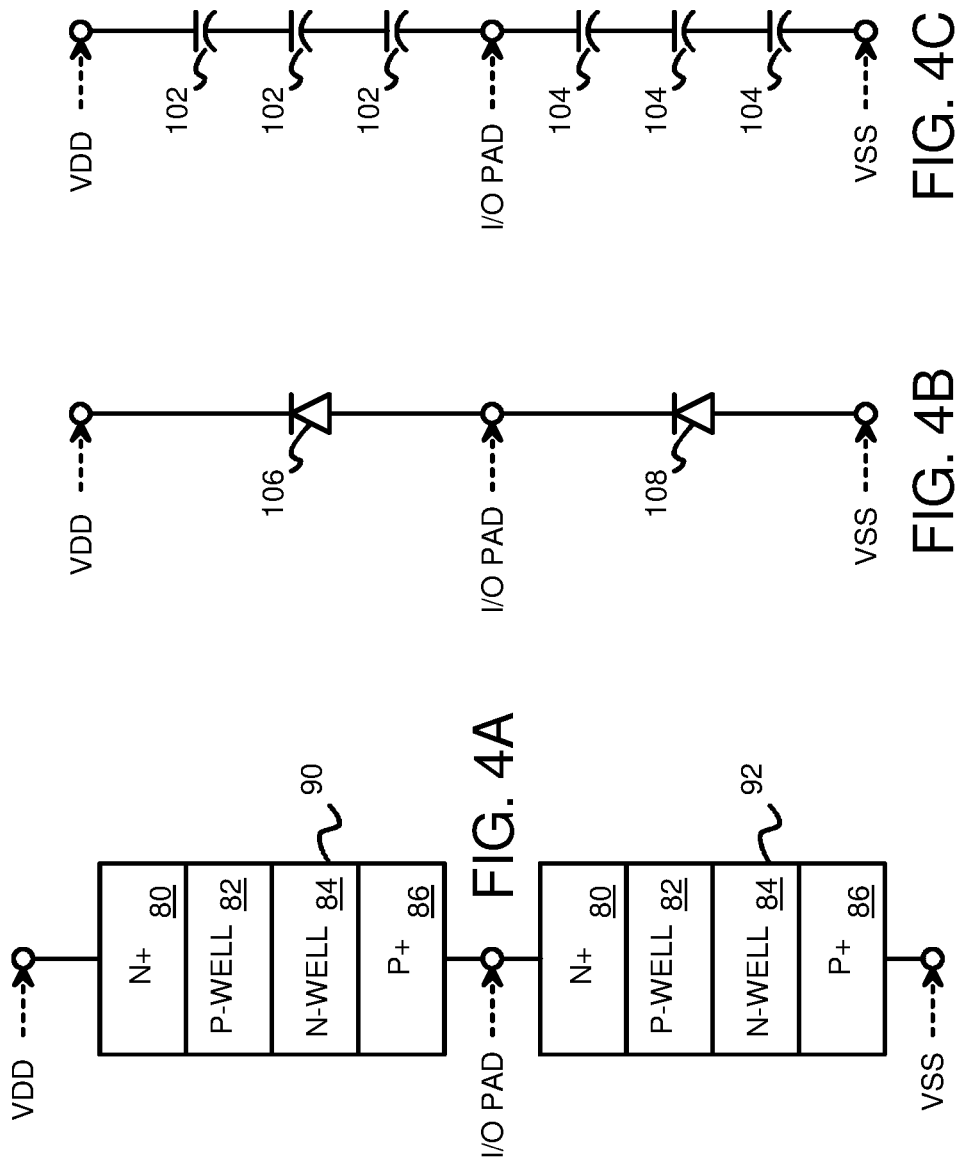
FIGS. 4A-4C shows an ESD device that acts like a large PN diode during an ESD event, but has a low capacitance of a series chain of capacitors during normal operation.

FIGS. 4A-4C shows an ESD device that acts like a large PN diode during an ESD event, but has a low capacitance of a series chain of capacitors during normal operation. In FIG. 4A, ESD device 90 is an NPNP structure formed by N+ fin 80, P-well 82, N-well 84, and P+ fin 86. While this could be an Silicon-Controlled Rectifier (SCR) structure, no active trigger is provided to turn on the SCR. Instead, P-Well 82 and N-well 84 are floated. The only electrical connections are at N+ fin 80, which is connected to VDD, and P+ fin 86, which is connected to the I/O pad. N+ fin 80 is the cathode (K) and P+ fin 86 is the anode (A) for an ESD test when the ESD pulse is applied between the I/O pad and VDD.

A second ESD device 92 is formed from N+ fin 80, P-well 82, N-well 84, and P+ fin 86, but is connected between the I/O pad and ground (VSS). Again, the cathode is N+ fin 80 and the anode is P+ fin 86, and P-well 82 and N-well 84 are floating, even during normal operation.

In FIG. 4B, ESD device 90 acts as p-diode 106, allowing a large current to flow during an ESD event. If a positive ESD pulse is applied to the I/O pad and VDD is grounded during an ESD test, p-diode 106 is forward biased and a large current flows.

Similarly, ESD device 92 acts as p-diode 108, allowing a large current to flow during an ESD event. If a negative ESD pulse is applied to the I/O pad and VSS is grounded during an ESD test, p-diode 108 is forward biased and a large current flows.

In FIG. 4C, since P-well 82 and N-well 84 are floating during normal operation, all three PN junctions in ESD device 90 appear as capacitors 102 in series between the I/O pad and VDD. When all capacitors have about the same capacitance value, three capacitors in series have a much lower effective capacitance than a single capacitor. For example, when C is the capacitance of each of capacitors 102, then the total capacitance of the series of 3 capacitors 102 is C/3.

Likewise, the three PN junctions in ESD device 92 appear as three capacitors 104 in series between the I/O pad and ground. If the ESD device were a simple PN-diode as shown in FIG. 4B, then there would be only a single capacitor 102 and a single capacitor 104. The total effective capacitance on the I/O pad is reduced by ⅔ due to the series capacitance.

Figure 3:
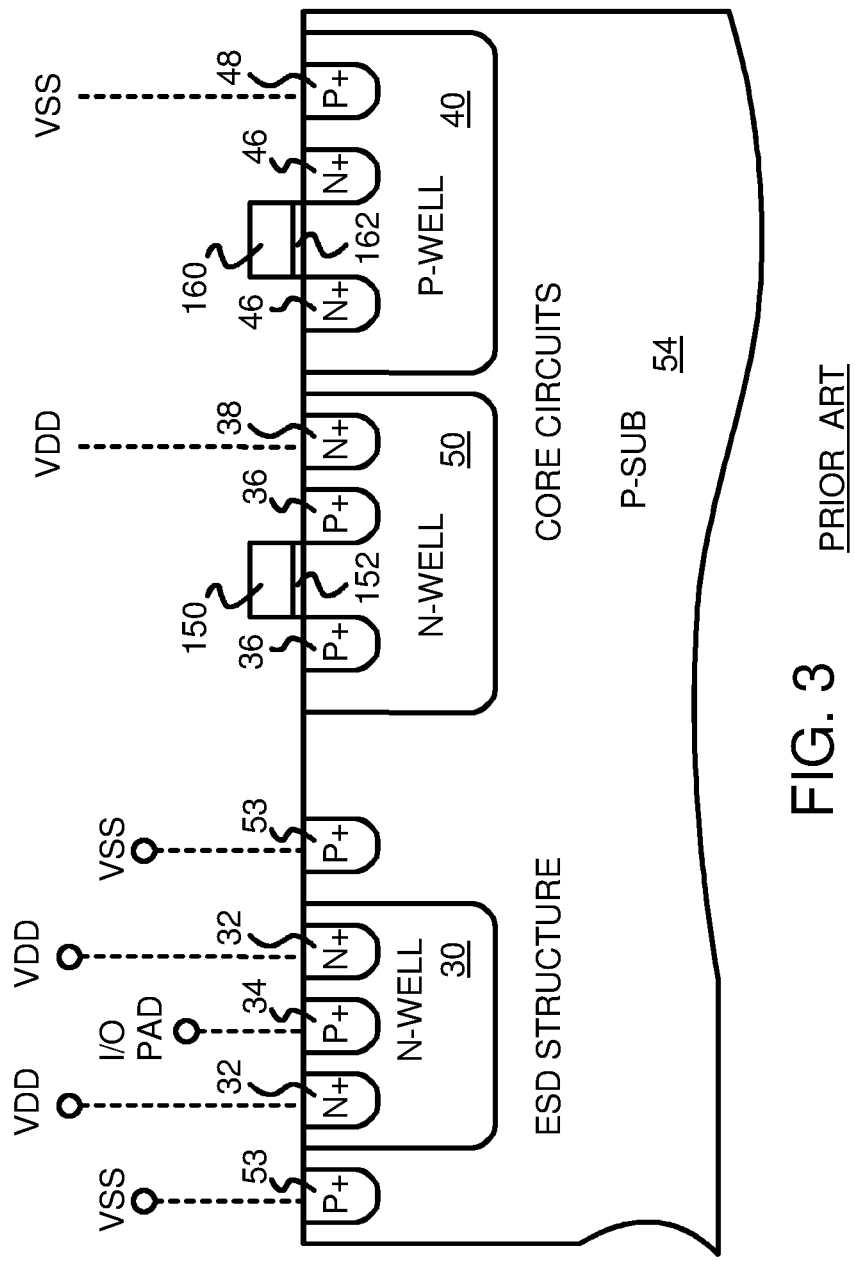
FIG. 3 is a cross-section of a prior-art device with an ESD structure.
Figure 5:
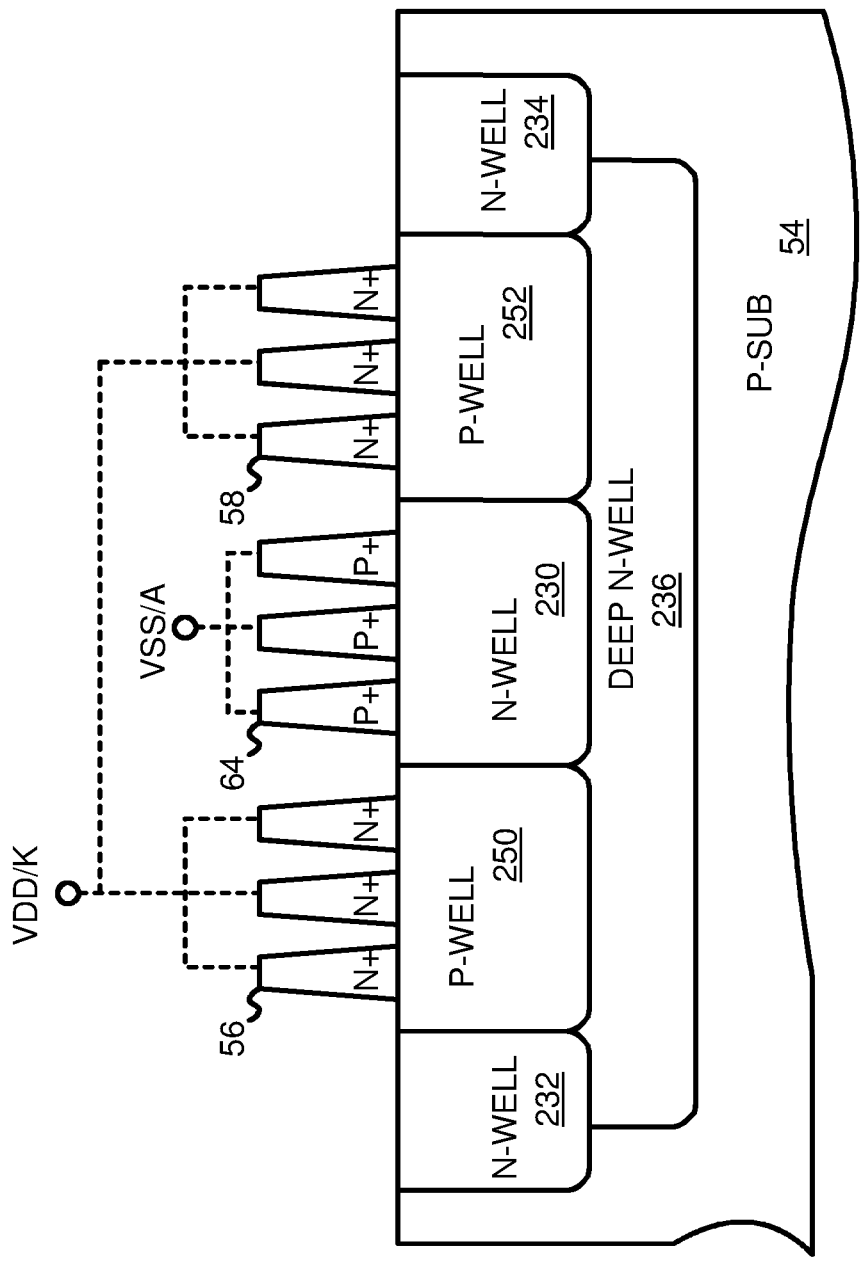
FIG. 5 shows an ESD protection device with floating wells to reduce capacitance.

FIG. 5 shows an ESD protection device with floating wells to reduce capacitance. P-type substrate 54 has other wells (not shown) that contain core circuitry, such as shown in FIG. 3. At least some of these P-wells would have a P+ tap 48 that is connected to ground, thus biasing that P-well to ground, and also causing p-type substrate 54 to be biased to ground because p-type substrate 54 is in contact with these other P-wells, as shown in FIG. 3. Thus p-type substrate 54 is likely to be biased to ground during normal operation and unlikely to be floating. Moreover, during an ESD test, the ESD tester may connect to the same ground that is connected to the P+ taps to the P-wells, causing p-type substrate 54 to be biased by the ESD tester in some configurations. Thus it cannot be assumed that p-type substrate 54 is floating, neither during normal operation nor during ESD testing.

Isolating N-wells 232, 234 are formed on all sides of the ESD structure, while deep N-well 236 is formed underneath the ESD structure. Thus the interior of the ESD structure is completely isolated from p-type substrate 54 by isolating N-wells 232, 234 and deep N-well 236. Any voltage bias on p-type substrate 54 cannot penetrate isolating N-wells 232, 234 and deep N-well 236 because they are an opposite polarity type.

The interior of the ESD structure is thus completely isolated from p-type substrate 54. Floating P-wells 250, 252 and floating N-well 230 are not electrically connected to p-type substrate 54, directly or indirectly, and any voltage bias on p-type substrate 54 cannot penetrate isolating N-wells 232, 234 and deep N-well 236.

Floating P-wells 250, 252 and floating N-well 230 also contain no tap regions. There are no P+ tap regions in floating P-wells 250, 252, and there are no N+ tap regions in floating N-well 230. Since there are no tap regions of the same doping type as the well, there is no bias applied to these floating wells. Floating P-wells 250, 252 and floating N-well 230 are truly floating, receiving no bias from a tap region and receiving no bias from p-type substrate 54.

Using a Fin Field-Effect Transistor (FinFET) manufacturing process, silicon fins are formed on top of the substrate with its wells. N+ fins 56 are silicon with an N+ doping in at least the upper part of the fin, and are formed on floating P-well 250. N+ fins 56 over floating P-well 250 form an N+-to-P diode. Oxide or other isolation layers are not shown but would surround the top and sides of the fins.

N+ fins 58 are also silicon with an N+ doping in at least the upper part of the fin, and are formed on floating P-well 252. N+ fins 58 over floating P-well 252 also form an N+-to-P diode.

P+ fins 64 are silicon with a P+ doping in at least the upper part of the fin, and are formed on floating N-well 230. P+ fins 64 over floating N-well 230 form a P+-to-N diode.

The positive terminal is connected to N+ fins 56 and to N+ fins 58, while the negative terminal is connected to P+ fins 64. For ESD device 90 (FIG. 4) connected between VDD and the I/O pad, N+ fins 56, 58 are connected to VDD and P+ fins 64 are connected to the I/O pad. For ESD device 92 (FIG. 4) connected between the I/O pad and VSS, N+ fins 56, 58 are connected to the I/O pad and P+ fins 64 are connected to VSS.

During an ESD event, when a positive ESD pulse is applied to the I/O pad, in device 90, the potential of P+ region 86 would rise. The potential difference across P+ region 86 and N+ region 80 increases. There are three PN diode junctions (86-84, 84-82, 82-80) in series within the device 90. While the potential difference across P+ region 86 and N+ region 80 increases, the width of depletion regions in these 3 diode junctions would also increase. If the width of regions 84 and 82 are small enough, ultimately, the boundary of the depletion regions in these 3 diode junctions would meet each other and the punch through phenomenon appears. The energy barriers in these 3 diode junctions disappear. Device 90 then behaves like a single diode in forward bias.

During an ESD event, when a negative ESD pulse is applied to the I/O pad, in device 92, the potential of N+ region 80 would fall. The potential difference across P+ region 86 and N+ region 80 increases. Similarly, the punch through phenomenon appears. Device 92 behaves like a single diode in forward bias Like a dual diode pair, with the assistance of power clamp, devices 90 and 92 provide protection against all ESD zapping combinations.

Although the ESD device has an NPNP structure like an SCR, the behavior is similar to that of a single diode during punch-through. Thus ESD device 90 can be modeled as diode 106 (FIG. 4B) during an ESD event when punch-through eventually occurs.

During normal operation, floating N-well 230 and floating P-wells 250, 252 remain un-biased, so that the PN junction between floating P-well 250 and floating N-well 230 appears as a parasitic capacitor. Likewise the PN junction between P+ fins 64 and floating N-well 230 appears as another capacitor in series with the well-to-well capacitor, and the PN junction between N+ fins 56 and floating P-well 250 appears as another capacitor in series with the well-to-well capacitor, for a total of three capacitors in series.

If one or more of floating N-well 230 and floating P-well 250 were biased during normal operation, the capacitors could be shorted out and no longer appear in series. This would raise the effective capacitance seen on the I/O pad. The higher effective I/O pad capacitance would tend to reduce high-speed performance.

Figure 6:
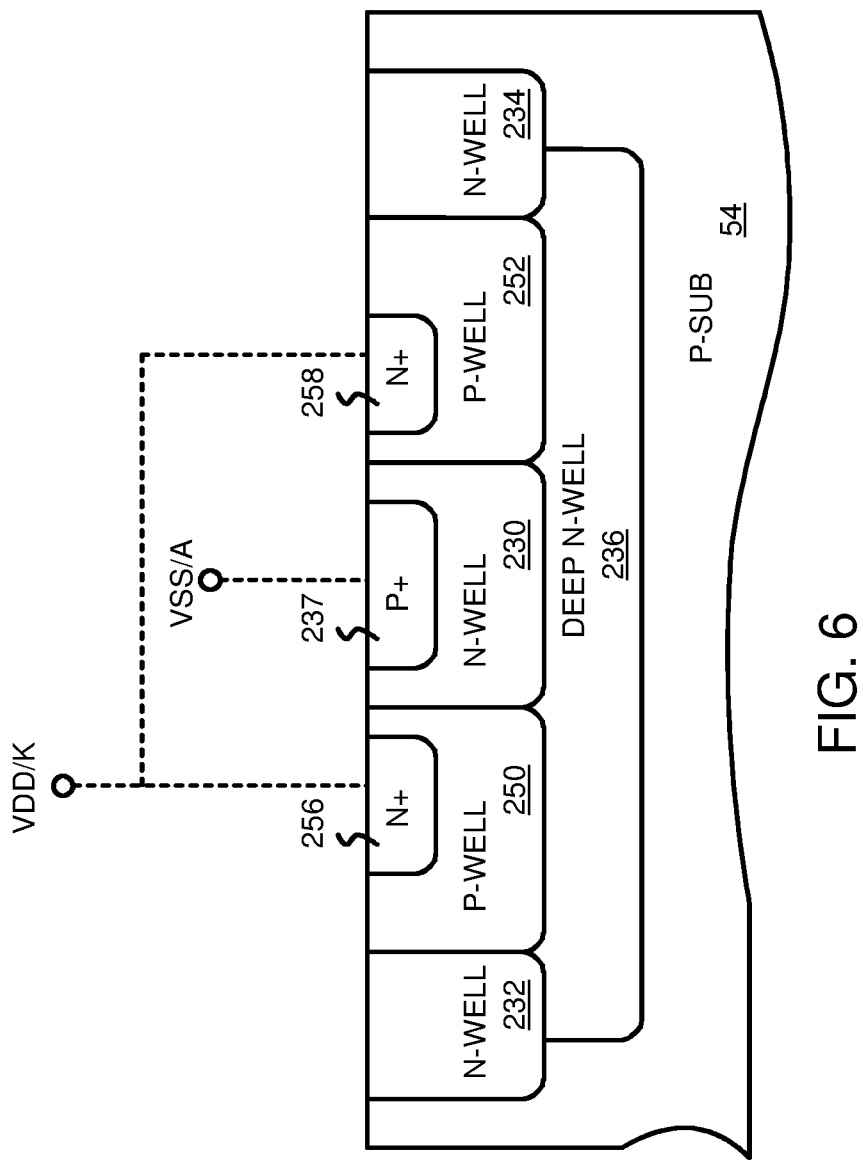
FIG. 6 shows the low-capacitance ESD device using a planar CMOS process with a deep well.

FIG. 6 shows the low-capacitance ESD device using a planar CMOS process with a deep well. The invention can be applied to non-FINFET processes that have a deep well. A standard CMOS process has an added step to form deep N-well 236 underneath floating P-wells 250, 252 and floating N-well 230. Rather than forming N+ fins, N+ region 256 is formed in floating P-well 250, such as by ion implantation.

N+ region 258 is likewise formed in floating P-well 252, and P+ region 237 is formed in floating N-well 230.

There are no tap regions formed in any of floating P-wells 250, 252, or floating N-well 230. There are no P+ regions formed within floating P-well 250 or within floating P-well 252, so that floating P-wells 250, 252 are not connected to a body bias such as ground. Likewise, there are no N+ regions formed in floating N-well 230, so that floating N-well 230 is not biased but is truly floating.

Deep N-well 236 isolates floating P-wells 250, 252 and floating N-well 230 from any substrate bias either directly applied to p-type substrate 54, or indirectly applied, such as by biasing another P-well formed in p-type substrate 54, such as for core circuitry.

Figure 7:
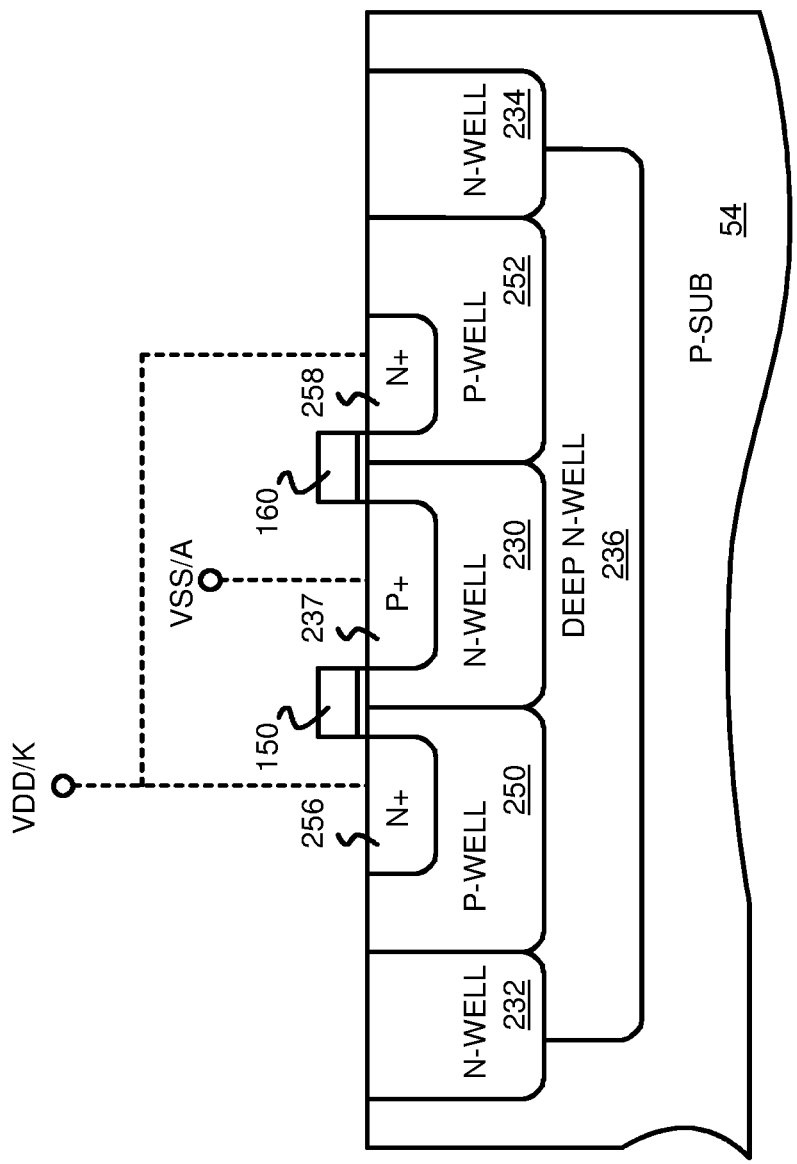
FIG. 7 shows adding polysilicon gates to the low-capacitance ESD device.

FIG. 7 shows adding polysilicon gates to the low-capacitance ESD device using the CMOS process with a deep well. The invention can be applied to non-FINFET processes that have a deep well. Poly gate 150 is formed over an oxide between floating N-well 230 and floating P-well 250. Poly gate 150 straddles the boundary between floating N-well 230 and floating P-well 250, from N+ region 256 to P+ region 237.

Likewise, the boundary between floating N-well 230 and floating P-well 252 has poly gate 160 formed over an oxide layer that is between P+ region 237 and N+ region 258.

Figure 8:
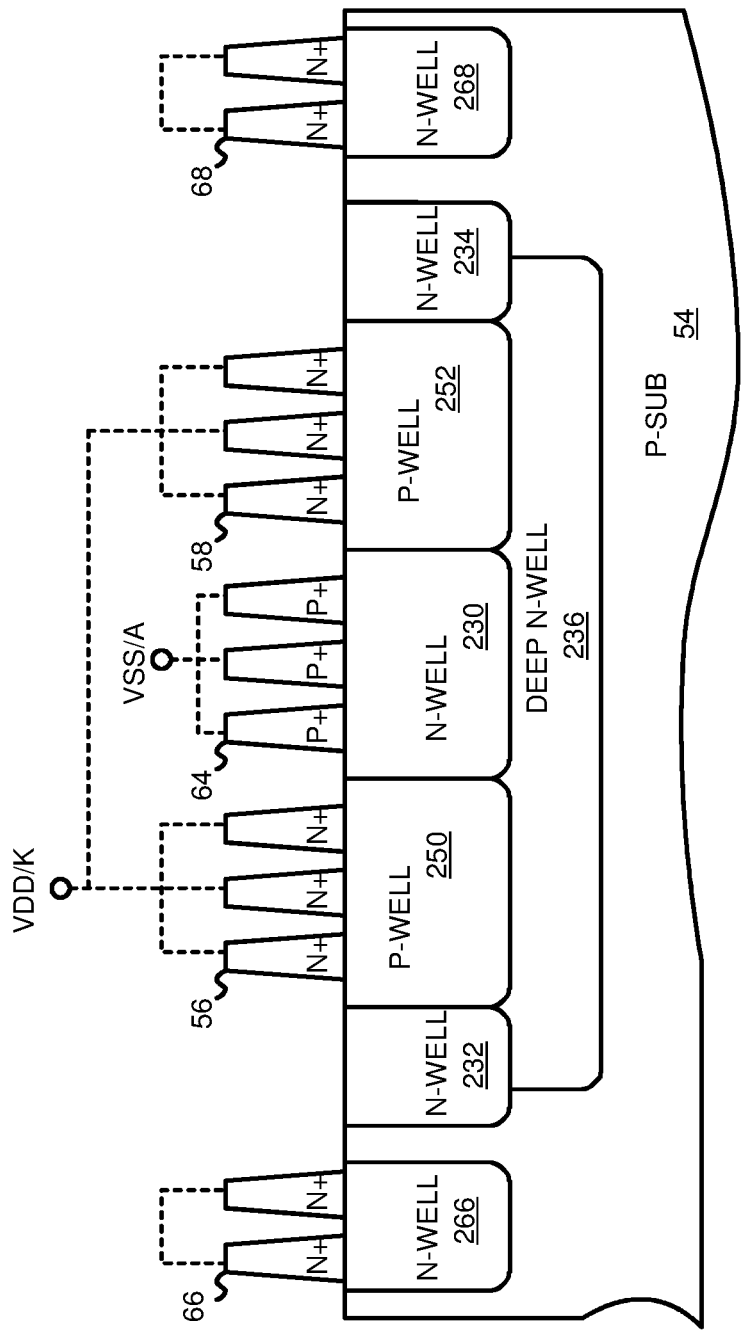
FIG. 8 shows the low-capacitance ESD device with an added guard ring.

FIG. 8 shows the low-capacitance ESD device with an added guard ring. Guard-ring N-well 266, 268 can surround isolating N-wells 232, 234 on all sides. Isolating N-wells 232, 234 and guard-ring N-well 266, 268 are separated by a portion of p-type substrate 54.

N+ fins 66 are formed over guard-ring N-well 266, while N+ fins 68 are formed over guard-ring N-well 268. N+ fins 66, 68 are well taps that reduce resistance in guard-ring N-well 266, 268. A bias voltage such as a VDD power voltage can be applied to N+ fins 66, 68, or N+ fins 66, 68 can be left floating.

Guard rings such as guard-ring N-well 266, 268 can be added to either the FINFET process of FIG. 5 or to the standard CMOS process of FIGS. 6-7. Guard rings can also be constructed from just an N+ fin or N+ region without Guard-ring N-well 266, 268 underneath. Also, guard rings can be N or P type, biased, floating, or interconnected. Guard rings can be added to protect against latch-up or to collect ESD current or leakage currents.

FIG. 9 shows two of the low-capacitance ESD structures connected in series. ESD device 90 is an NPNP structure formed by N+ fin 80, P-well 82, N-well 84, and P+ fin 86, and can be a FINFET device such as shown in FIG. 5 without a guard ring, or in FIG. 8 with a guard ring. Alternately, ESD device 90 can be a standard CMOS deep-well device such as shown in FIG. 6 or FIG. 7, or can be various combinations of these features.

Rather than have just one ESD device 90 between the I/O pad and VDD, there can be two ESD devices 90, 90' in series. Having two ESD devices 90, 90' in series increases the number of series parasitic capacitors from 3 to 6, further reducing the parasitic capacitance on the I/O pad. There are two diode voltage drops between VDD and the I/O pad when both ESD devices 90, 90' are used in series, which may be useful in some applications, such as for reducing capacitance even further.

Various other passive devices, such as capacitors, resistors, diodes, and inductors, may be placed in series or in parallel with ESD device 90, and many networks of parallel and/or series combinations are possible. More than two ESD devices 90, 90' may be placed in series.

ALTERNATE EMBODIMENTS

Several other embodiments are contemplated by the inventors. For example the layout and geometry of the ESD device can affect its performance. Having the floating P-well 250 to floating N-well 230 boundary equidistant between N+ fins 56 and P+ fins 64 may allow the well depletion regions to reach both N+ fins 56 and P+ fins 64 at about the same time, spreading out current crowding. Alternatively, having the well boundary closer to either N+ fins 56 or to P+ fins 64 may allow for closer control of the initiation of punch-through.

In FIG. 7, poly gates 150, 160 can be floating or can be connected to a fixed voltage such as VDD or VSS, and can be standard polysilicon, or various other gate materials. The oxide underneath poly gates 150, 160 can be a gate oxide, or can be a thicker field or isolation oxide, or can be combinations of both, such as a thick oxide near the well boundary, but a thin gate oxide near the P+, N+ regions or fins. The gate oxide can replace a shallow trench isolation or oxide to allow a more direct discharge path.

In the FINFET process of FIG. 5, poly gates could be added that extend across the well boundary between floating N-well 230 and floating P-well 250, 252, similar to poly gates 150, 160 of FIG. 7.

Various materials may be used. Substrate 54 may be silicon, or may be silicon-germanium, or other compounds such as Ga—As and may have various dopants added. Likewise, N+ fins 56 and P+ fins 64 may be made from the same material as p-type substrate 54, or may be a different material such as SiGe, and may have different dopants in different concentrations or profiles. Although the dopant concentration tends to vary within a region, the dopant concentration may still be considered to be relatively constant when compared with the rapid change in dopant concentration near region boundaries.

The substrate, p-type substrate 54, is substantially planar although there may be variations of its upper surface due to features being etched into the top surface. The fin structure is substantially perpendicular to the planar surface of the substrate. The fin's sidewalls can be slopped somewhat, perhaps being within 20 degrees of perpendicular to the substrate's generally planar surface. The centerline between the two sidewalls can be nearly perpendicular, with no more than 20 degrees from being perpendicular to the plane of the substrate.

The semiconductor process used to manufacture the FinFET may have several variations. The VDD power supply voltage may be 1.8 volt or some other value. The alternatives may be combined in various ways, or used separately or in other combinations.

While deep N-well 236 in p-type substrate have been described, a deep P-well in an n-type substrate could be substituted. Various alternate transistor technologies such as Bipolar or BiCMOS could be added.

While descriptions of current flows and operations have been presented, these are theoretical and the theories may be incomplete or even incorrect. Regardless of the physical mechanisms and theoretical interpretations, the structure does offer protection from ESD pulses. Especially for small devices, currents may flow in unusual ways and using mechanisms that have not yet been thoroughly researched and understood.

Cutouts in diffusion and other regions may be used. Other shapes and physical layouts may be substituted, such as intermingled fingers. The layout could have isolating N-wells 232, 234 merging with floating N-well 230 so that they are all one interconnected N-well. Floating N-well 230 could be completely surrounded by floating P-well 250 and floating P-well 252 when floating P-well 250, 252 are merged together, such as by forming a ring or doughnut shape when the layout is viewed from above. In FIG. 5, the second floating P-well 252 and the second isolating N-well 234 could be deleted, and deep N-well 236 could end underneath floating N-well 230. P+ fins 64 could also be placed over isolating N-well 232 to the left of floating P-well 250 in that variation.

Rather than have isolating N-wells 232, 234 on the lateral sides of floating P-wells 250, 252, isolating N-wells 232, 234 could be eliminated and deep N-well 236 could perform the lateral isolation function of isolating N-wells 232, 234. When deep N-well 236 is a buried layer without sufficient surface doping to form a well near the surface, then isolating N-wells 232, 234 are needed.

Devices may be implemented using n-channel, p-channel, or bipolar transistors, or junctions within these transistors. A capacitor could be attached to a resistance to provide an R-C time delay, or more complex circuits such as active triggering circuits may be added. In some embodiments, high-voltage transistors may be used rather than low-voltage transistors with appropriate bias conditions. The gate lengths can be increased to provide better protection from damage.

Different transistor, capacitor, resistor, and other device sizes can be used, and various layout arrangements can be used, such as multi-leg, ring, doughnut or irregular-shape transistors. Additional taps, guard rings, transistors, and other components may be added. The power node could be a common-discharge line (CDL) that normally floats rather than a power line. While a simple inverter of core transistors 22, 24 has been shown, more complex gates and interconnections may drive internal nodes, and there can be several internal nodes that connect to different input or output pads. The input/output pads may be connected to an input buffer, test-scan logic, and other circuits. More than one power supply may be used.

P and N wells could be reversed, and a PNPN ESD device used rather than a NPNP ESD device. A deep P-well could be used or a deep N-well. Some embodiments may use an additional deep N+ or P+ implant region, or the location and depth of implant regions may be shifted. The final profiles and shapes of various layers may differ depending on the process used. In particular, deeper layers may shift around relative to the mask layouts. Also, the mask edges and final processed boundaries may differ with process steps.

The shape of the ESD device may differ, such as by having a more rounded bottom or field-oxide boundaries. Guard rings may be continuous or have openings or cutouts for various reasons. Both a P+ and an N+ guard ring could be used. P+ and N+ guard rings may be electrically connected together and left floating or connected to a fixed voltage such as the power supply or ground, or may be connected to different voltages, such as connecting a P+ guard ring to ground and an N+ guard ring to the power supply. The voltage biases to guard rings may be actively switched, or muxed for various modes and conditions of operation.

Additional leaker devices such as resistors and small transistors could be added. Parasitic capacitances and resistances may be used from some components, depending on the process and device sizes used.

The ESD-protection circuit can be combined with other input-protection circuits, such as a power clamp circuit, other pad protection circuits, or a series-resistor protection circuit to the gate of an input buffer. Grounded-gate and thick oxide protection transistors and diodes can also be added at various points to increase ESD protection. One, two, or four of the ESD structures could be added to each I/O pin, or just to input pins.

Figure 1:
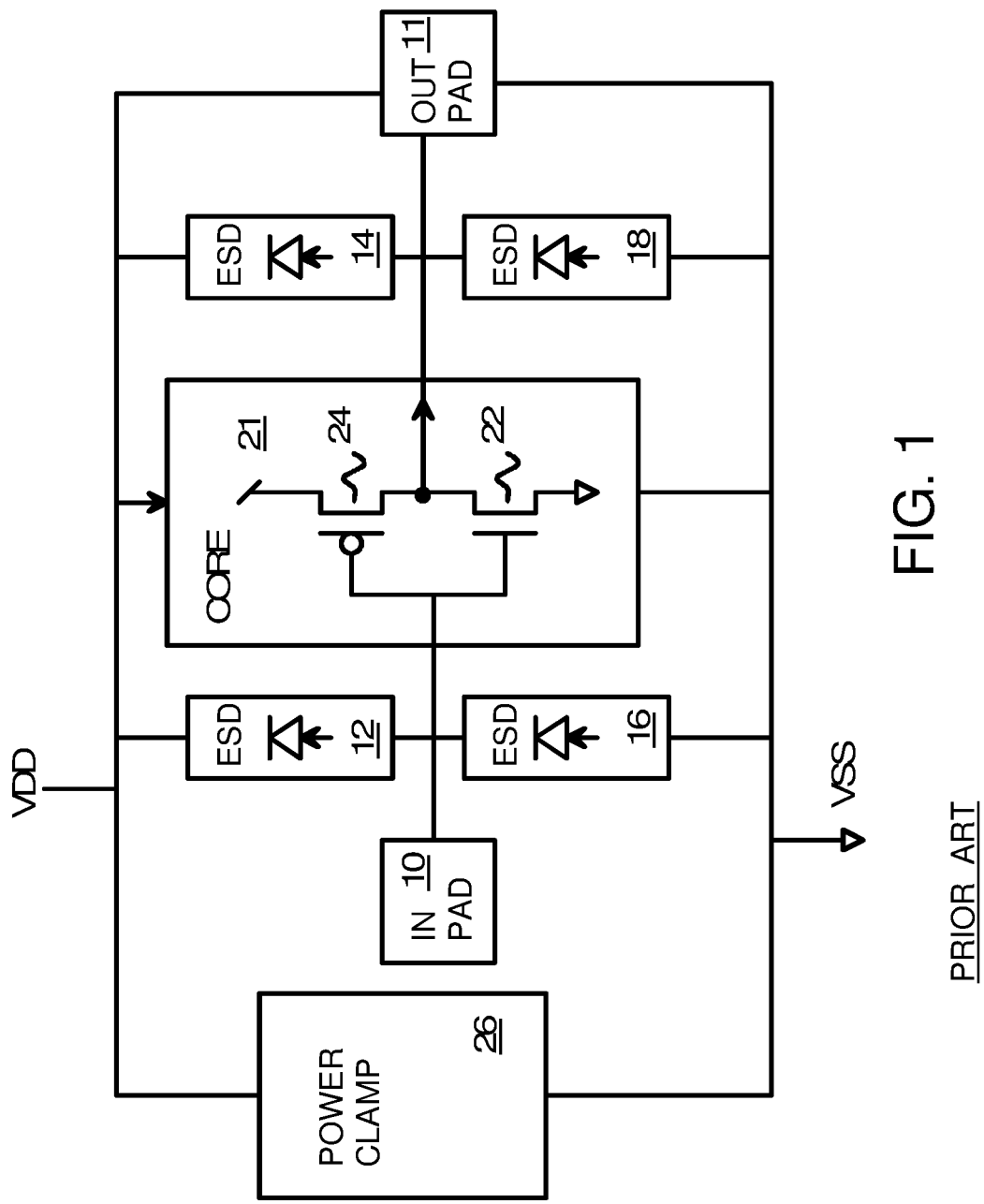
FIG. 1 shows a chip with several ESD-protection clamps.
Figure 2:
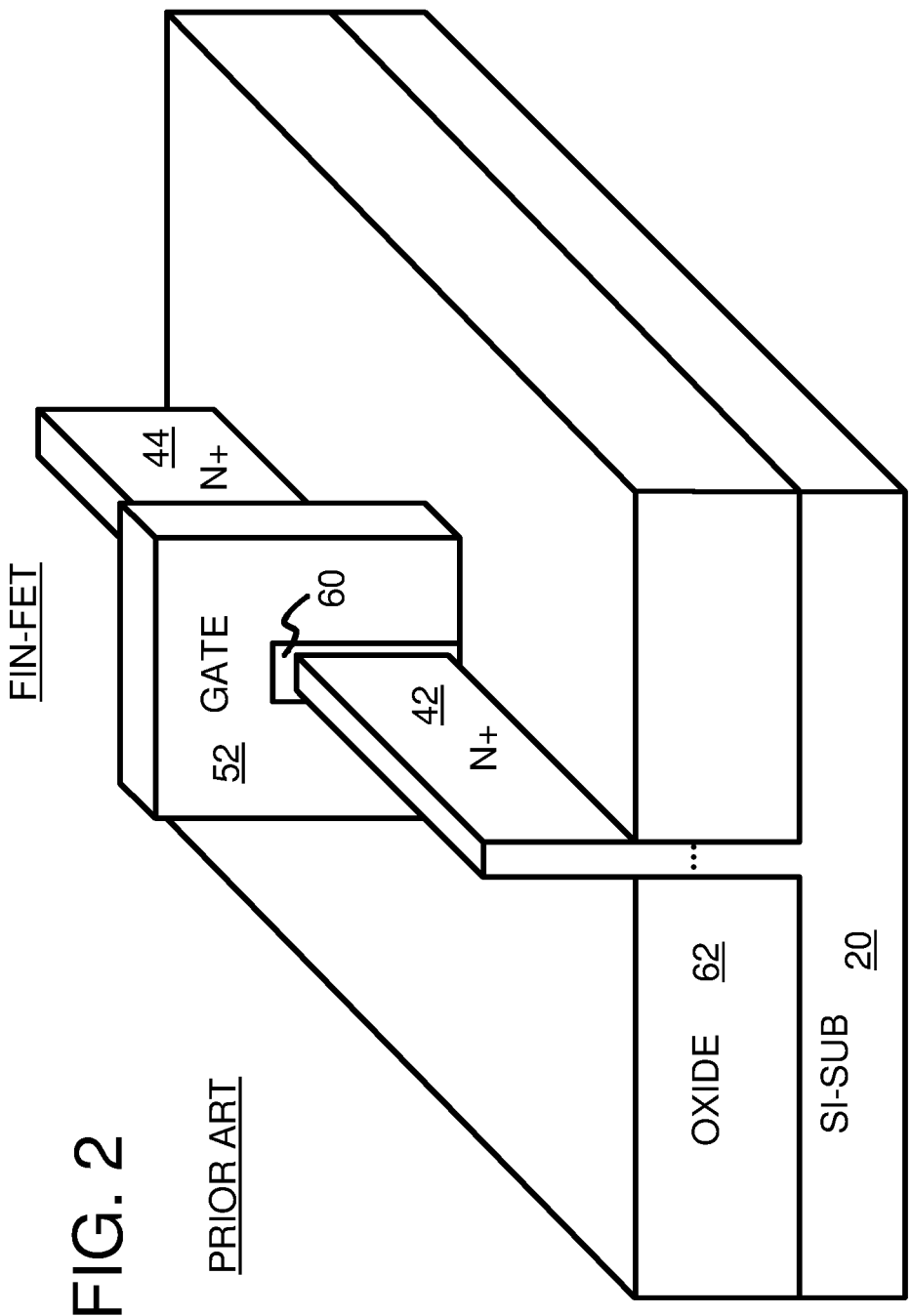
FIG. 2 shows a prior-art FinFET device.

Both thick oxide and thin oxide transistors may be protected by the power clamp and ESD protection devices. Alternately, several power clamps with different combinations of transistors and power-supply voltages may be used. Each pad may have only one ESD protection device, only two ESD protection devices, or four ESD protection devices as shown in FIG. 1. The anode and cathode (A and K) nodes may be reversed to swap the direction of protection.

Bias, VDD, and voltage values may vary somewhat due to process, temperature, and design variances. Snap-back or punch-through voltages may vary with process, temperature, and exact geometries of the transistors. While descriptions of operation have been given based on a theoretical understanding of the physical processes, these theoretical descriptions may be incorrect. Second and third order effects may also be present. Various mechanisms may be responsible for breakdown and conduction under various conditions.

Large output driver transistors also act as large diodes for some ESD tests and conditions. For example, when the ESD pulse is applied across an I/O pad and the power-supply pad, a positive ESD pulse can turn on a parasitic p-n drain-substrate junction of the drain of the large p-channel driver transistor. The n-type substrate or well of the p-channel driver transistor is normally connected to the I/O power supply. Thus the p-n junction is forward biased by the positive ESD pulse. While output pads have been described, other connection technologies may be substituted, such as ball-grid-array (BGA), flip-chip, etc., and the term pads is considered to apply to all such balls, pads, landings, etc. that are for external connection.

Likewise, when the ESD pulse is applied across the I/O pad and the ground pad, a negative ESD pulse can turn on the parasitic n-p drain-substrate junction of the drain of the large n-channel driver transistor. The p-type substrate or well of the n-channel driver transistor is normally connected to the I/O ground. Thus the p-n junction is forward biased by the negative ESD pulse. Various cross-domain coupling paths and mechanisms may exist that couple ESD pulses applied to one power-supply domain to another power-supply domain.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An Electro-Static-Discharge (ESD) structure comprising:
    a substrate having a first dopant polarity;
    a deep well having a second dopant polarity that is an opposite polarity to the first dopant polarity, the deep well formed in the substrate;
    a first floating well, having the first dopant polarity, formed within the deep well, the first floating well being a shallower well than the deep well wherein the first floating well is isolated from the substrate by the deep well;
    a second floating well, having the second dopant polarity, formed within the deep well and adjacent to the first floating well, wherein a well-to-well electrical diode junction is formed where the second floating well contacts the first floating well;
    a first highly-doped region, formed near an upper surface of the first floating well, the first highly-doped region having a higher concentration of a second dopant than a concentration of the second dopant in the second floating well, the first highly-doped region forming a first electrical diode junction with the first floating well;
    a second highly-doped region, formed near an upper surface of the second floating well, the second highly-doped region having a higher concentration of a first dopant than a concentration of the first dopant in the first floating well, the second highly-doped region forming a second electrical diode junction with the second floating well;
    a first terminal connected to the first highly-doped region; and
    a second terminal connected to the second highly-doped region;
    wherein an Electro-Static-Discharge (ESD) current is applied between the first terminal and the second terminal during an ESD test;
    wherein the ESD current is conducted by the first electrical diode junction, the well-to-well electrical diode junction, and the second electrical diode junction when the ESD current is applied between the first terminal and the second terminal during the ESD test;

wherein the first floating well has no electrical connections to any other nodes, power sources, or grounds, other than a connection to the first terminal through the first highly-doped region.

2. The ESD structure of claim 1 wherein the second floating well has no electrical connections to any other nodes, power sources, or grounds, other than a connection to the second terminal through the second highly-doped region,
wherein the second floating well is disconnected from all nodes except for the connection to the second terminal through the second highly-doped region.

3. The ESD structure of claim 2 wherein the deep well has no electrical connections to any other nodes, power sources, or grounds, other than a connection to the second terminal through the second highly-doped region and through the second floating well,
wherein the deep well is disconnected from all nodes except for the connection to the second terminal through the second highly-doped region and the second floating well.

4. The ESD structure of claim 3 wherein the first dopant polarity is a positive polarity and the second dopant polarity is a negative polarity, wherein the substrate is a p-type substrate.

5. The ESD structure of claim 4 wherein the first highly-doped region is formed below the upper surface and inside the first floating well;
wherein the second highly-doped region is formed below the upper surface and inside the second floating well.

6. The ESD structure of claim 4 wherein the first highly-doped region is formed in a fin that is substantially above the upper surface of the first floating well;
wherein the second highly-doped region is formed in a fin that is substantially above the upper surface of the second floating well;
wherein the ESD structure is formed by a Fin Field-Effect Transistor (FinFET) semiconductor process.

7. The ESD structure of claim 6 further comprising:
a lateral isolating well, having the second dopant polarity, formed adjacent to and in lateral contact with the first floating well, the lateral isolating well formed between the first floating well and a surrounding region without wells wherein the substrate having the first dopant polarity reaches the upper surface.

8. The ESD structure of claim 7 wherein the second floating well is laterally surrounded by the first floating well, the first floating well having a ring shape when viewed from above the upper surface.

9. The ESD structure of claim 8 further comprising:
a guard ring, formed in the surrounding region of the substrate outside of and surrounding the deep well.

10. The ESD structure of claim 4 further comprising:
a first gate formed on the substrate above an oxide, the first gate straddling the well-to-well electrical diode junction formed where the second floating well contacts the first floating well.

11. An Electro-Static-Discharge (ESD) input-protection device comprising:
a p-type substrate of a semiconductor material;
a deep N-well formed in the p-type substrate, the deep N-well having no wells taps or connections to power or ground, the deep N-well being unbiased;
a floating P-well formed in the deep N-well, the floating P-well being shallower than the deep N-well wherein the deep N-well isolates the floating P-well from making electrical contact with the p-type substrate underneath;
a floating N-well formed in the deep N-well, the floating N-well laterally touching the floating P-well to form a well-to-well diode;
a P+ region contacting the floating N-well to form a P+N diode, the P+ region connected to a first terminal for receiving ESD current; and
an N+ region contacting the floating P-well to form a N+P diode, the N+ region connected to a second terminal for receiving ESD current;
wherein the floating P-well, the floating N-well, and the deep N-well have no wells taps or connections to power or ground;
wherein the floating P-well, the floating N-well, and the deep N-well are unbiased.

12. The ESD input-protection device of claim 11 wherein the P+ region contacting the floating N-well comprises a first plurality of fins formed to protrude above an upper surface of the substrate, the first plurality of fins formed by a Fin Field-Effect Transistor (FinFET) process;
wherein the N+ region contacting the floating P-well comprises a second plurality of fins formed to protrude above the upper surface of the substrate, the second plurality of fins formed by a Fin Field-Effect Transistor (FinFET) process.

13. The ESD input-protection device of claim 11 further comprising:
an isolating N-well that is shallower than the deep N-well, formed at an edge of the deep N-well and formed adjacent to the floating P-well, the isolating N-well having no wells taps or connections to power or ground.

14. The ESD input-protection device of claim 11 further comprising:
a guard ring, surrounding the deep N-well, the guard ring having a plurality of N+ taps that are electrically connected together.

15. A Fin Field-Effect Transistor (FinFET) Electro-Static-Discharge (ESD) protection device comprising:
a substrate having a substantially planar surface, the substrate having a low concentration of a first dopant type;
a plurality of fins formed on a surface of the substrate, each fin being of a semiconductor material;
a first floating well, formed in the substrate and having a low concentration of the first dopant type;
a second floating well, formed in the substrate and having a low concentration of a second dopant type, the second floating well and the first floating well being in contact with each other at a well-to-well junction;
a deep well formed underneath the first floating well, and having a low concentration of the second dopant type;
an isolating well, formed in the substrate and having a low concentration of the second dopant type;
wherein the first floating well is isolated from the substrate by the deep well and the isolating well that surround the first floating well to prevent electrical contact with the substrate;
a first fin in the plurality of fins, the first fin having a high concentration of the second dopant type and being formed over the first floating well having the first dopant type, wherein the first fin is in contact with the first floating well at a first junction;
a second fin in the plurality of fins, the second fin having a high concentration of the first dopant type and being formed over the second floating well having the second dopant type, wherein the second fin is in contact with the second floating well at a second junction;

a first electrical terminal connected to the first fin; and
a second electrical terminal connected to the second fin;
wherein an Electro-Static-Discharge (ESD) applied between the first electrical terminal and the second electrical terminal causes the well-to-well junction to punch-through and conduct in a forward-biased diode current flow.

16. The FinFET ESD protection device of claim 15 wherein the first dopant type is a positive type and the second dopant type is a negative type.

17. The FinFET ESD protection device of claim 16 wherein the high concentration of the first dopant type is at least ten times the low concentration of the first dopant type;
wherein the high concentration of the second dopant type is at least ten times the low concentration of the second dopant type.

18. The FinFET ESD protection device of claim 15 wherein the first floating well is unbiased, having no connections to any tap regions formed from a high concentration of the first dopant type;
wherein the second floating well is unbiased, having no connections to any tap regions formed from a high concentration of the second dopant type;
wherein the first and second floating wells are untapped.

19. The FinFET ESD protection device of claim 15 wherein the first floating well is unconnected, having no connections to any electrical nodes or voltages outside of the first floating well;
wherein the second floating well is unconnected, having no connections to any electrical nodes or voltages outside of the second floating well,
wherein the first and second floating wells are not connected to any voltage or node.

20. The FinFET ESD protection device of claim 15 where each fin in the plurality of fins has a cross-sectional shape having a height above the surface of the substrate that is at least double an average width of the cross-sectional shape.

* * * * *